(12) United States Patent
Hirahara et al.

(10) Patent No.: US 6,417,461 B1
(45) Date of Patent: Jul. 9, 2002

(54) CIRCUIT SUBSTRATE

(75) Inventors: Seiichi Hirahara; Akira Nakayama; Akira Imoto; Shuji Nakazawa; Tatsuji Furuse, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/699,666

(22) Filed: Oct. 30, 2000

(30) Foreign Application Priority Data

Oct. 29, 1999 (JP) ............................. 11-308363
Nov. 30, 1999 (JP) ............................. 11-339973
Mar. 29, 2000 (JP) ........................ 2000-092469

(51) Int. Cl.$^7$ .................................. H05K 1/03; H05K 1/04
(52) U.S. Cl. ..................... 174/256; 174/201; 361/750
(58) Field of Search ..................... 174/256, 257, 174/201; 439/687; 428/204; 427/304, 301; 333/116, 128, 161, 246; 361/774, 776, 750

(56) References Cited

U.S. PATENT DOCUMENTS

| | | | | |
|---|---|---|---|---|
| 5,620,800 A | * | 4/1997 | De Leeuw et al. | ......... 174/276 |
| 5,918,150 A | * | 6/1999 | Nguyen et al. | ............ 438/687 |
| 6,274,823 B1 | * | 8/2001 | Khandros et al. | ........... 361/776 |

FOREIGN PATENT DOCUMENTS

| | | | |
|---|---|---|---|
| JP | 410116831 | * | 5/1998 |
| JP | 02000228461 | * | 8/2000 |

* cited by examiner

Primary Examiner—Albert W. Paladini
(74) Attorney, Agent, or Firm—Hogan & Hartson, L.L.P.

(57) ABSTRACT

A circuit substrate in which the conductor portions constituting the functional devices formed in the insulating board have interfacial electric conductivities σ of not larger than $2.90 \times 10^7 \, \Omega^{-1} \cdot m^{-1}$ to greatly lower the insertion losses.

12 Claims, 2 Drawing Sheets

CIRCUIT SUBSTRATE

BACKGROUND OF THE INVENTION

1. Field of the Invention

The present invention relates to a circuit substrate equipped with an insulating board formed by laminating plural insulating layers. More specifically, the invention relates to a circuit board which has functional devices with conductor portions formed in the insulating board, and is capable of decreasing the insertion losses for high-frequency signals.

2. Description of the Prior Art

A variety of electronic devices as represented by cellular phones are incorporating a circuit substrate which has functional devices with conductor portions, such as resonators, capacitors, inductors, etc. formed in an insulating board.

The circuit substrate incorporated in the electronic devices such as cellular phones is used for transmitting high-frequency signals of chiefly in the microwave band, and must have small insertion losses for the high-frequency signals. To realize low insertion losses, it is necessary to accomplish an optimum circuit design, such as matching the impedance of the circuit, suppressing undesired interference among the circuits, and improving the Q-values of the resonators. It has further been attempted to lower the dielectric loss of a dielectric material constituting the insulating board and to decrease the conduction loss of the conductor portion by forming the conductor portions by using Ag or Cu having a small volume resistivity. For example, the conductor portions having a small conduction loss can be formed in the insulating board by using a conductor such as Ag or Cu, i.e., by using ceramics (inclusive of glass ceramics), and firing the ceramics at a low temperature at which Au or Cu particles are sintered. In this case, the diameters and shapes of Ag or Cu particles are contrived, or suitable additives are added to the conductor such as Ag or Cu, so that the Ag or Cu particles are sintered to meet the behavior of sintering the ceramics, or to improve the adhesion of the conductor portions formed of Ag or Cu to the ceramics.

In modern electronic devices such as cellular phones, however, it has been highly urged to decrease the size and to improve performance. In particular, the requirement for lowering the insertion losses for high-frequency signals cannot be satisfied by the above-mentioned methods only.

SUMMARY OF THE INVENTION

It is therefore an object of the present invention to provide a circuit substrate having functional devices formed in an insulating board, and exhibits small insertion losses for high-frequency signals in the microwave band.

The present inventors have forwarded the study in an effort to decrease the insertion losses of the circuit substrate incorporating functional devices, have discovered the fact that the insertion losses can be decreased by controlling the interfacial state between dielectric ceramics constituting the insulating board and conductor portions constituting the functional devices, and by controlling the interfacial electric conductivities σ of the conductor portions to be not larger than a predetermined value.

According to the present invention, there is provided a circuit substrate equipped with an insulating board formed by laminating plural insulating layers and having a functional device with a conductor portion formed in said insulating board, wherein an interfacial electric conductivity σ of said conductor portion at 2 GHz is not smaller than $2.9 \times 10^7 \, \Omega^{-1} \cdot m^{-1}$.

In the circuit substrate of the present invention, the conductor portion which constitutes the functional device such as a resonator, a capacitor or an inductor has an interfacial electric conductivity σ that is set to lie in a very high range as described above and, hence, makes it possible to decrease the insertion losses in the functional device at a high-frequency region of not lower than 800 MHz. It is therefore allowed to enhance the performance of the electronic device incorporating the above circuit substrate while decreasing noise. It is further allowed to effectively avoid an increase in the insertion losses despite of decreasing the size of the circuit substrate (or functional devices). Accordingly, the circuit substrate of the present invention is advantageous for decreasing the size of the electronic devices.

The interfacial electric conductivity σ of the conducting portion vary depending upon the firing condition (particularly, depending upon the firing temperature). When the circuit substrate is produced by, for example, the cofiring, diffusion takes place excessively between the conducting material forming the conductor portion and the ceramics as the firing temperature increases, and the interfacial electric conductivity σ of the formed conductor portion tends to decrease. In order to set the interfacial electric conductivity of the conductor portion to be large values as described above, it is desired that the firing is carried out at a temperature as low as possible.

Further, the interfacial electric conductivity σ of the conductor portion in the microwave band vary depending greatly upon the coarseness of the surface of the conductor portion contacting to the insulating layer; i.e., the interfacial electric conductivity σ increases as the surface become smooth. In the present invention, therefore, it is desired that the surface of the conductor portion contacting to the insulating layer has a coarseness Ra (JIS B 0601) of not larger than 1 μm and, particularly, not larger than 0.5 μm.

In the present invention, it is desired that the conductor portion constituting the functional device is formed by using Ag or Cu as a conducting material since it has a small conduction loss.

In the present invention, further, it is desired that at least one layer among the plural insulating layers is formed of dielectric ceramics containing, as a chief component, a composite oxide of Mg and Ti (e.g., $MgTiO_3$). The insulating layer formed of such dielectric ceramics has a small dielectric loss and a high Q-value (quality value), and makes it possible to further decrease the insertion losses of the circuit substrate.

According to the present invention, further, it is desired that the neighboring insulating layers (first insulating layer and second insulating layer) are formed of dielectric ceramics of different compositions among the plural insulating layers, and that these dielectric ceramics include a common crystal phase expressed by the following formula,

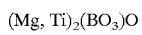

That is, in a circuit substrate incorporating the functional device, some of the plural insulating layers are often formed of insulating materials of different compositions. For example, in a circuit substrate containing a capacitor as the functional device, the insulating layer sandwitched by the conductor portions is formed of an insulating material having a high dielectric constant. In the circuit substrate in which are existing the insulating layers formed of different kinds of materials, cracks and delamination take place among the insulating layers formed of different materials and other neighboring insulating layers and the insulating board is warped due to different heat characteristics such as coefficient of contraction by firing and coefficient of thermal expansion. Upon having the above-mentioned common crystal phase existing in the first and second insulating layers that are neighboring to each other and are formed of different materials, it is allowed to bring the heat characteristics such as coefficient of contraction by firing and coefficient of thermal expansion into match together to effectively avoid the above-mentioned inconvenience. That is, the above circuit board offers an advantage of a very high degree of freedom for designing the circuit.

DETAILED DESCRIPTION OF THE INVENTION

Figure 1:
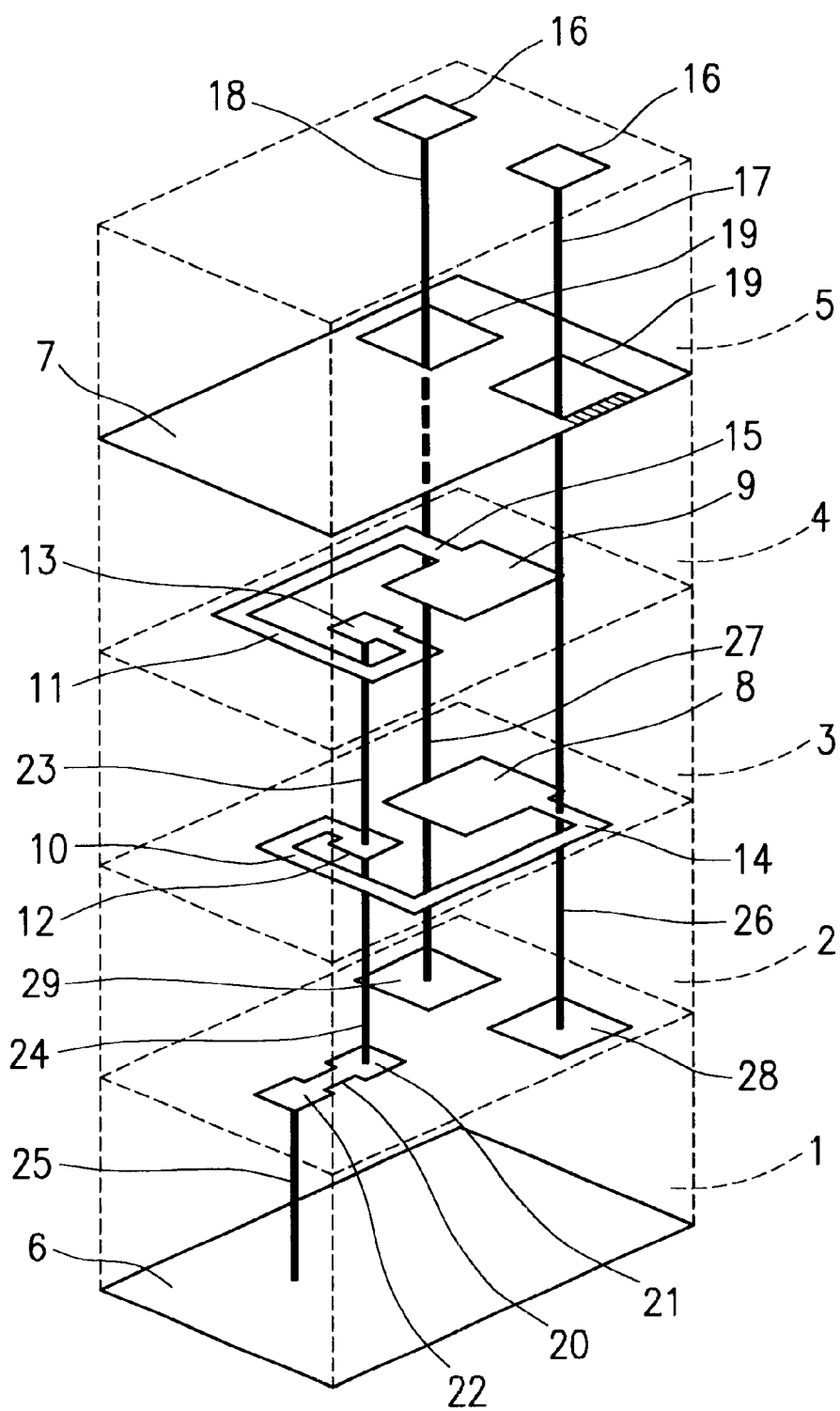
FIG. 1 is a perspective view illustrating a circuit substrate of the present invention.

Referring to FIG. 1 illustrating the structure of an LC filter which is a representative example to which the circuit substrate of the invention is applied, the insulating board is constituted by five insulating layers 1 to 5, and grounding conductors 6, 7 are formed on the lower surface of the insulating layer 1 and on the upper surface of the insulating layer 4. Conductors 8 and 9 for forming capacitors are formed on the upper surfaces of the insulating layers 2 and 3, and input/output capacitors are formed by these conductors 8, 9 and by the insulating layer 3 sandwiched therebetween.

Further, resonance lines 10, 11 are formed on the upper surfaces of the insulating layers 2 and 3 to constitute inductors. Lands 12, 13 are formed at the ends on one side of the resonance lines 10, 11, and input/output lands 14, 15 are formed at the other ends thereof. These input/output lands 14, 15 are connected to the surface conductor 16 formed on the upper surface of the insulating layer 5 through via-hole conductors 17 and 18 for inputting and outputting signals.

In order that the grounding conductor 7 formed on the upper surface of the insulating layer 4 will not become conductive to the via-hole conductors 17, 18 for inputting/outputting signals, openings 19, 19 are formed in the grounding conductor 7, and the via-hole conductors 17, 18 for inputting/outputting signals are inserted in the openings 19, 19.

Further, a resonance line 20 that constitutes a resonator is formed on the upper surface of the lowermost insulating layer 1, and to the one end thereof is connected a land 21 and to the other end thereof is connected a land 22. The above-mentioned lands 12 and 13 are connected together through a via-hole conductor 23, the land 12 and the land 21 are connected together through a via-hole conductor 24, and the land 22 and the grounding conductor 6 are connected together through a via-hole conductor 25. As a result, an inductor is formed by the resonance line 20 and the via-hole conductors 24, 25.

In the present invention, it is important that the interfacial electric conductivities σ of the conductors 8, 9 forming capacitor, of the resonance lines 10, 11 constituting inductor and of the resonance line 20 constituting resonator, are not smaller than 2.9×10$^7$ Ω$^{-1}$·m$^{-1}$ at 2 GHz, i.e., the interfacial electric conductivities σ on the interfaces between these conductor portions and the insulating layers 1, 2, 3, 4 are not smaller than 2.9×10$^7$ Ω$^{-1}$·m$^{-1}$ at 2 GHz. When the interfacial electric conductivities σ are smaller than this value, insertion losses of the capacitor, inductor and resonator increase, causing the insertion losses of the LC filter as a whole to increase.

In order to decrease the insertion losses of the LC filter as a whole, it is desired that the interfacial electric conductivities σ of the conductor portions other than those described above such as of grounding conductors 6, 7 and lands 12, 13, 14, 15, 21, 22, and surface conductors 16 are not smaller than 2.9×10$^7$ Ω$^{-1}$·m$^{-1}$ at 2 GHz relative to the substrate. In the following description, the value of the interfacial electric conductivities σ are those at 2 GHz.

It is further desired that various conductor portions in the LC filter are formed of Ag or Cu in order to decrease the conductor loss.

In the present invention, the interfacial electric conductivities σ of the conductor portions vary depending upon the firing conditions (particularly, firing temperature) at the time of preparing the circuit substrate and the surface coarseness of the conductor portions. In order to confine the interfacial electric conductivities of the conductor portions within the above-mentioned range, therefore, it is desired that the circuit substrate is prepared by cofiring at a temperature as low as possible and that the coarseness (Ra) of the surfaces of the conductor portions contacting to the insulating layers 1 to 4 is not larger than 1 μm (JIS B 0601) and, particularly, not larger than 0.5 μm.

(Insulating Layers)

In the circuit substrate of the present invention, the insulating layers constituting the insulating board may be those of a known insulating material, such as dielectric ceramics (inclusive of glass ceramics), organic resin, or organic resin to which are added inorganic fillers and fibers. Here, however, it is particularly desired that the insulating layers 1 to 4 that constitute the functional devices (capacitors, inductors, resonators) are formed of dielectric ceramics having a dielectric loss at 2 GHz of not larger than 10×10$^{-4}$ and, particularly, not larger than 8×10$^{-4}$. That is, when the insulating layers 1 to 4 are formed of dielectric ceramics having such a small dielectric loss, high Q-values are exhibited by the insulating layers, and the insertion losses of the circuit substrate further decrease. Further, use of the dielectric ceramics is advantageous even from the standpoint of adjusting the interfacial electric conductivities σ of the conductor portions formed on the insulating layers 1 to 4 to lie within the above-mentioned range.

In the present invention, it is preferred that the above-mentioned ceramics contains a main component comprising a composite oxide which contains Mg and Ti.

As such dielectric ceramics, therefore, there can be exemplified MgTi/Ca ceramics containing a Mg—Ti composite oxide component represented by the following formula, $$MgTiO_3$$

and Ca—Ti composite oxide component represented by the following formula, $$CaTiO_3$$

at a ratio that satisfies the molar composition represented by the following formula (I), $$(1-x)MgTiO_3 \cdot xCaTiO_3 \qquad (I)$$

wherein x is a number satisfying 0 ≦ x ≦ 0.2.

It is desired that the above ceramics contains, as components stemming from the sintering assistant and filler, B in an amount of from 3 to 20 parts by weight calculated as $B_2O_3$, an alkali metal in an amount of from 1 to 10 parts by weight calculated as a carbonate, Si in an amount of from 0.01 to 5 parts by weight reckoned as $SiO_2$, and an alkaline earth metal in an amount of from 0.1 to 5 parts by weight calculated as an oxide per a total amount of 100 parts by weight of the Mg—Ti composite oxide component and the Ca—Ti composite oxide component. Upon forming the insulating layers 1 to 4 by using the MgTi/Ca ceramics having such a composition, it is allowed to set the dielectric losses of the insulating layers at 2 GHz to lie within the above-mentioned low range. Further, since the MgTi/Ca ceramics is capable of forming a densely sintered product upon the firing at a low temperature (from 800 to 1050° C.), it is allowed to produce the circuit substrate by the cofiring with the conducting material (Ag, Cu) forming the conductor portions at a low temperature. During the firing, therefore, diffusion is effectively suppressed between the conducting material forming the conductor portions and the ceramics, and the interfacial conductivities σ of the conductor portions can be set to be not smaller than $2.9 \times 10^7$ $\Omega^{-1} \cdot m^{-1}$.

In the MgTi/Ca ceramics, the alkali metal may be any one of Li, Na or K. Among them, however, Li is desired. Further, the alkaline earth metal may be any one of Ca, Sr or Ba. Among them, however, Ba is desired.

As the dielectric ceramics other than the above-mentioned MgTi/Ca ceramics, there can be exemplified forsterite ceramics comprising chiefly crystal particles of a composite oxide of Mg and Ti, and crystal particles of forsterite. The forsterite ceramics contains boron (B), lithium (Li) and alkaline earth metals on the grain boundaries, and contains the forsterite component represented by the following formula, $$Mg_2SiO_4$$

and the Mg—Ti composite oxide component represented by the following formula, $$MgTiO_3$$

at a ratio that satisfies a molar composition represented by the following formula (II), $$(1-y)Mg_2SiO_4 \cdot yMgTiO_3 \qquad (II)$$

wherein y is a number satisfying $0 < y \leq 0.8$, and may further contain B in an amount of from 3 to 20 parts by weight calculated as $B_2O_3$, Li in an amount of from 1 to 10 parts by weight and, particularly, from 4 to 9 parts by weight calculated as a carbonate, alkaline earth metals in an amount of from 1 to 5 parts by weight and, particularly, from 1.5 to 3.5 parts by weight calculated as an oxide, and Si in an amount of not larger than 30 parts by weight and, particularly, not larger than 10 parts by weight calculated as $SiO_2$, per a total amount of 100 parts by weight of the Mg—Ti composite oxide component and the forsterite component.

By using the forsterite ceramics of this composition, it is allowed to form insulating layers having high Q-values and to decrease the insertion losses of the circuit substrate (LC filter). The forsterite ceramics has a low contraction-start temperature and is densely sintered by the firing at a low temperature of from about 800 to about 1050° C. It is therefore allowed to produce the circuit substrate equipped with the conductor portions having the interfacial electric conductivties σ lying within the above-mentioned range upon cofiring with the conducting material (Ag, Cu) for forming the conductor portions. Decreased insertion losses are exhibited even by the thus produced circuit substrate.

Further, the forsterite ceramics may contain Mn in an amount of from 0.1 to 3 parts by weight and, particularly, from 1.2 to 1.8 parts by weight calculated as $MnO_2$, in order to improve the sintering property.

In the present invention, it is desired that the insulating layers 1 to 4 forming the functional devices (capacitors, inductors, resonators) are all formed of the above-mentioned MgTi/Ca ceramics or forsterite ceramics having a small dielectric loss. However, the insulating layer 5 forming no functional device may be formed of an insulating material having a large dielectric loss.

Here, the MgTi/Ca ceramics has such dielectric characteristics as a high dielectric constant (usually, a dielectric constant capacity $\in r$ of not smaller than 18) while the forsterite ceramics which contains forsterite having a low dielectric constant, exhibits a dielectric constant capacity $\in r$ which is as low as from 6 to 12. In the present invention, therefore, the insulating layers that form the functional devices and that must have a large capacity, are desirably formed of the MgTi/Ca ceramics.

In the circuit substrate (LC filter) of FIG. 1, on the other hand, when the insulating layers 1 to 5 constituting the insulating board are all formed of the MgTi/Ca ceramics, stray capacities (parasitic capacities) occur among the wiring conductors that are formed on the insulating layer 5, deteriorating the high-frequency characteristics and imposing limitation upon the circuit design.

In the LC filter of the structure shown in FIG. 1, therefore, it is most desired that the insulating layers 1 to 4 forming the functional devices are formed of the MgTi/Ca ceramics, and the insulating layer 5 forming no functional device is formed of the forsterite ceramics having a low dielectric constant. That is, upon forming the insulating layer 5 using the forsterite ceramics, occurrence of parasitic capacity is effectively suppressed, and limitation on the circuit design is avoided. Besides, the LC filter in which the insulating layers 1 to 4 are formed of the MgTi/Ca ceramics and the insulating layer 5 is formed of the forsterite ceramics, exhibits the advantage of effectively preventing the occurrence of cracks, delamination, warping, etc. (in the present invention, it is most preferable that the capacitor and the resonator among the functional device has an insulating layer formed of the MgTi/Ca ceramics having a high $\in r$ and the inductor has an insulating layer formed of the forsterite ceramics having a low $\in r$.

That is, when the insulating board is constituted by laminating the insulating layers of dielectric ceramics of different compositions, there occur cracks and delamination, and, depending upon the cases, the insulating substrate as a whole is warped by heating during the firing due to difference in the thermal characteristics such as coefficient of contraction by firing and coefficient of thermal expansion. However, both of the above-mentioned MgTi/Ca ceramics and forsterite ceramics precipitate, upon firing, the compound represented by the following formula, $$(Mg,Ti)_2(BO_3)O$$

on the crystal phase. That is, a common crystal phase comprising the above compound is existing in the insulating layers (e.g., insulating layers 1 to 4 of FIG. 1) formed of the MgTi/Ca ceramics and in the insulating layer (e.g., insulating layer 5 in FIG. 1) formed of the forsterite ceramics. Therefore, they exhibit similar thermal characteristics (coefficient of contraction by firing and coefficient of thermal expansion) to effectively avoid the above-mentioned problems.

In the present invention, when the insulating layer formed of the forsterite ceramics and the insulating layers formed of the MgTi/Ca ceramics are laminated one upon the other, it is desired that the molar ratio y of $Mg_2SiO_4$ and $MgTiO_3$ represented by the above-mentioned formula (II) is not larger than 0.5 from the standpoint of equalizing their coefficients of contraction by firing. In the example of FIG. 1, further, it is desired that the insulating layer 5 which is the uppermost layer of the insulating board is formed of the forsterite ceramics. However, when the insulating board includes an insulating layer that does not require a large capacity owing to the structure of the functional device, then, this insulating layer only may be formed of the forsterite ceramics. (Production of the circuit substrate)

The circuit substrate of the present invention as represented by the LC filter shown in FIG. 1 can be produced by, for example, a method described below.

First, the above-mentioned starting MgTi/Ca ceramics powder or the starting forsterite ceramics powder is prepared. The starting MgTi/Ca ceramics powder is obtained by blending the $MgTiO_3$ powder or the $CaTiO_3$ powder with powders of assistants such as a $B_2O_3$ powder, a powder of a carbonate or an oxide of an alkali metal, an $SiO_2$ powder and a powder of an alkaline earth metal oxide at a ratio that satisfies the above-mentioned composition. The starting forsterite ceramics powder is obtained by blending the $Mg_2SiO_4$ powder or the $MgTiO_3$ powder with powders of assistant components (e.g., a $B_2O_3$ powder, a powder of a carbonate or an oxide of Li, a powder of an alkaline earth metal oxide, an $SiO_2$ powder and an $MnO_2$ powder) at a ratio that satisfies the above-mentioned composition. Among these starting ceramics powders, some of the assistant components can be added as a glass frit.

The above starting ceramic powders are pulverized and mixed together, followed, as required, by calcining at a temperature of from about 650 to 850° C. The obtained powder is pulverized and mixed by using $ZrO_2$ balls or the like to adjust the particle size to a suitable degree (e.g., not larger than 2.5 μm). Then, an organic binder is mixed thereto to prepare a ceramic slurry. The ceramic slurry is then formed into a ceramic green sheet by a known molding means such as a press-molding method or a doctor blade method.

Via-holes (through-holes) are formed in the ceramic green sheet and are filled with an electrically conducting paste to form via-hole conductors. Further, the electrically conducting paste is applied onto the surface of the ceramic green sheet in such patterns as capacitors, inductors, grounding conductors and the like by the screen-printing method or the like method.

As the electrically conducting paste, use is made of the one obtained by mixing an organic binder to an electrically conducting material such as Ag powder or Cu powder. In order to enhance the cofiring property with the green sheet and to enhance the adhesion between the conductor portions that are formed and the insulating layers, however, a glass frit containing some of the components (e.g., assistant components) in the starting ceramic powder can be mixed into the electrically conducting paste. As the amount of the additives increases, however, the interfacial electric conductivties σ of the formed conductor portions decrease and the conduction losses increase, too. Therefore, the amount of addition should not be larger than 10 parts by weight and, particularly, not larger than 5 parts by weight per 100 parts by weight of the electrically conducting material powder.

The green sheet on which the via-hole conductors and the conductor patterns are formed as described above, is then laminated in position on a desired circuit substrate, which are then cofired at a temperature over a range of from 800 to 1050° C. to obtain the circuit substrate of the present invention.

The surfaces of the conductor portions formed on the surfaces of the insulating layers easily trace the shapes of the surfaces of the insulating layers which are contacting thereto. Upon applying a glass paste containing some components (e.g., assistants) of the ceramic starting powder onto the surfaces of the ceramic green sheet that comes in contact with the conductor patterns, therefore, a glass layer having a flat surface can be formed on the surfaces of the insulating layers that come into contact with the conductor portions when they are laminated. Upon forming the glass layer, the roughness Ra on the surfaces of the conductor portions in contact with the insulating layers can be greatly decreased to be, for example, not larger than 1 μm and, particularly, not larger than 0.5 μm to greatly enhance the interfacial electric conductivties σ of the conductor portions. It is desired that the glass layer has a thickness of from 1 to 20 μm and, particularly, from 1 to 10 μm.

EXPERIMENTS

The invention will now be described by way of experiments.

Experiment 1

A circuit substrate (LC filter) of the structure shown in FIG. 1 in which the insulating layers were of glass ceramics was prepared according to a method described below.

A $MgTiO_3$ powder and a $CaTiO_3$ powder having purities of not lower than 99% as starting materials, a glass frit comprising a $B_2O_3$ powder, a powder of a carbonate of an alkali metal, an $SiO_2$ powder and a powder of an oxide of an alkaline earth metal, were weighed at ratios shown in Table 1, and were wet-mixed for 20 hours by a ball mill using $ZrO_2$ balls using pure water as a medium.

Next, the mixture was dried, calcined at 800° C. for one hour, and the calcined product was pulverized such that the pulverized particles possessed diameters of not larger than 1 μm. The powder, an organic binder and a solvent were kneaded together to prepare a slurry which was then formed into a green sheet by the doctor blade method.

Via-holes were formed in the green sheet as shown in FIG. 1, and were filled with an electrically conducting paste. Further, the electrically conducting paste was applied by printing onto the surface of the green sheet in such patterns as capacitors, inductors and grounding conductors. Here, the conductor paste was the one comprising a metal powder (100 parts by weight), additives, an organic binder and a solvent shown in Table 2. As the glass in the additives, use was made of a crystallized glass of the type of $B_2O_3$—$SiO_2$—MgO—$Al_2O_3$—ZnO. The ratio of the glass in the additive in Table 2 was 90% by weight of the whole amount of the additive.

After placed in position, the green sheets were laminated and were sintered as a unitary structure at a temperature in a range of from 800 to 1050° C. When the Ag powder was used as the conducting material in the conducting paste, the firing was conducted in the open air and when the Cu powder was used, the firing was conducted in an atmosphere of a mixture of nitrogen and hydrogen. In conducting the firing, the time for maintaining the firing temperature, the time for raising the temperature up to the firing temperature and the time for lowering the temperature from the firing temperature were controlled to prepare circuit substrates (samples Nos. 1 to 20) having various surface coarsenesses of the insulating layers on which are formed conductor portions for constituting capacitors, inductors and resonators.

The insertion losses of the thus obtained circuit substrates (LC filters) at 2 GHz were measured by using a network analyzer. Further, the roughness (Ra) on the surfaces of the conductors on the side of the insulating layers were measured relying upon BEM (reflected electron image) of a scanning-type electron microscope. The results were as shown in Table 2.

Further, the substrates for evaluation having quite the same structure were prepared but forming the electrically conducting layer on the whole surfaces of the inner insulating layers on the circuit substrates, and the interfacial electric conductivities between the electrically conducting layers and the insulating layers of the substrates for evaluation were measured to evaluate the interfacial electric conductivities of the circuit substrates. The results were as shown in Table 2.

The conductor layers of the substrates for evaluation possessed a thickness of 0.02 mm, and the insulating layers on the upper and lower sides thereof possessed a thickness of 0.2 mm. The interfacial electric conductivities were measured in compliance with the dielectric pole resonator method described below.

According to this method of measuring the interfacial electric conductivities, a dielectric resonator is formed by attaching the insulating layer having the conductor formed therein onto both end surfaces or onto one end surface of a dielectric pole made of a dielectric material of which the dielectric constant capacitance and the dielectric loss have been known, so as to establish a predetermined relationship, in order to measure the electric conductivity on the interface between the conductor and the insulating layer, i.e., on the interface of the electric conductor.

This measuring method is based on a principle in that when an electromagnetic resonator is constituted by holding, in parallel, electrically conducting plates (usually having a diameter D about three times as great as the diameter d of the dielectric pole) which are so large that the edge effect can be neglected on both end surfaces of the dielectric pole having a predetermined dimensional ratio (height t/diameter d), a high-frequency current that flows into the conductor plates due to TEomn resonance mode is distributed on the short-circuited surfaces only, i.e., on only the surfaces where the dielectric and the conductor are opposed to each other.

Figure 2:
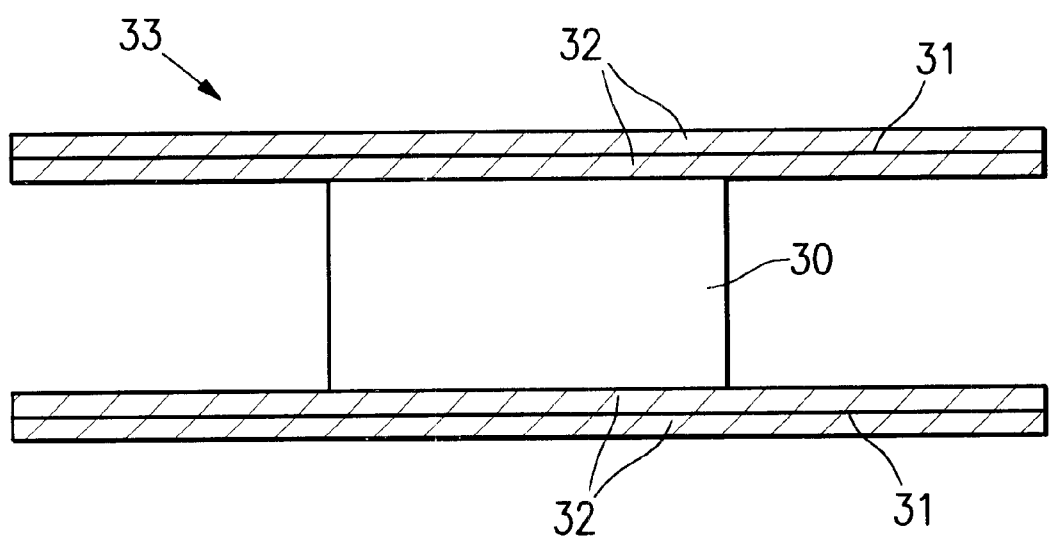
FIG. 2 is a view schematically illustrating the structure of a dielectric resonator used for the measurement of the interfacial electric conductivity σ of the conductor portions.

Concretely speaking as shown in FIG. 2, dielectric substrates 32 having an electrically conducting layer 31 formed therein are arranged on both end surfaces of a dielectric pole 30 of sapphire (diameter d=10.000 mm, height t=5.004 mm) having end surfaces perpendicular to the C-axis, and the dielectric pole is held from both ends to constitute a dielectric resonator 33.

In the dielectric resonator 33, a high-frequency current that flows into the conductor 31 in the TEomn mode (m=1, 2, 3, - - -, n=1, 2, 3, - - -) is distributed only in the interface of the dielectric substrate 32 where the conductor 31 and the dielectric pole 30 are contacted to each other. By utilizing this fact, the interfacial electric conductivity σ int can be calculated from the TEomn mode(m=1, 2, 3, - - -, n=1, 2, 3, - - -) that is measured and from no load Q, Qu in compliance with the following formula (A), $$\sigma_{int}\left[A \bigg/ \left(\frac{1}{Q_u} - B_1\tan\delta_1 - B_2\tan\delta_2\right)\right]^2 \quad (1)$$

where A, $B_1$ and $B_2$ are calculated from the following formulas (2), (3) and (4), $$A = \sqrt{\frac{\mu}{8\omega}} \int\int |H|^2 ds/W^e \quad (2)$$

$$B_1 = W_{d1}^{\ e}/W^e \quad (3)$$

$$B_2 = W_{d2}^{\ e}/W^e \quad (4)$$

and where tan $\delta_1$ and tan $\delta_2$ of the formula (1) are dielectric tangents of the dielectric pole 30 and of the dielectric substrate 32, $\mu$ is a magnetic permeability of the conductor 31, ω is $2\pi f_0, \int\int |H|^2 ds$ is an integration of a magnetic field on the upper and lower interfaces of a metal layer, $W^e$ is an electric field energy of the resonator, $W_{d1}^{\ e}$ and $W_{d2}^{\ e}$ are electric field energies on the side contacting to the dielectric cylinder 30 between the inside of the dielectric pole 30 and the dielectric substrate 32.

Here, $\in_1$ and tan $\delta_1$ of the dielectric pole 30 can be measured according to the dielectric pole resonator method disclosed in JIS-R-1627 "Method of Testing Dielectric Characteristics of Fine Ceramics for Microwaves", and the dielectric constant capacitance $\in'_2$ and tan $\delta_2$ of the dielectric substrate 32 can be measured by a known method such as the cavity resonator method disclosed in Kobayashi, Sato et al., "Measurement of Microwave Complex Dielectric Constant" (Shingaku-giho MW87-7, 1987). Table 2 shows the thus measured interfacial electric conductivities. It was confirmed that the interfacial electric conductivities were substantially the same on both interfaces of the conductor layer in the substrate for evaluation.

TABLE 1

| Sample No. | MgTiO$_3$/ CaTiO$_3$ (mol) | B$_2$O$_3$ (parts by wt.) | Alkali metal (parts by wt.) | | SiO$_2$ (parts by wt.) | Alkaline earth metal (parts by wt.) | | Dielectric loss 2 GHz × 10$^{-6}$ |
|---|---|---|---|---|---|---|---|---|
| *1 | 0.08 | 12 | Li | 6 | — | — | — | 5.9 |
| 2 | 0.08 | 14 | Li | 6 | 0.94 | Ca | 2.3 | 6.7 |
| 3 | 0.08 | 14 | Li | 6 | 0.94 | Sr | 2.3 | 6.5 |
| 4 | 0.08 | 14 | Li | 6 | 0.94 | Ba | 2.3 | 6.3 |
| 5 | 0.08 | 14 | Li | 6 | 0.94 | Ba | 2.3 | 6.3 |
| 6 | 0.08 | 14 | Li | 6 | 0.94 | Ba | 2.3 | 6.3 |
| *7 | 0.08 | 14 | Li | 6 | 0.94 | Ba | 2.3 | 6.3 |

TABLE 1-continued

| Sample No. | MgTiO$_3$/ CaTiO$_3$ (mol) | B$_2$O$_3$ (parts by wt.) | Alkali metal (parts by wt.) | | SiO$_2$ (parts by wt.) | Alkaline earth metal (parts by wt.) | | Dielectric loss 2 GHz × 10$^{-6}$ |
|---|---|---|---|---|---|---|---|---|
| 8 | 0.08 | 14 | Na | 6 | 0.46 | Ba | 2.2 | 6.5 |
| 9 | 0.08 | 13 | K | 6 | 0.67 | Ba | 3.5 | 7.1 |
| *10 | 0.08 | 15 | Li | 7 | 5.62 | Ba | 5.3 | 14.3 |
| 11 | — | 14 | Li | 7 | 0.86 | Ba | 2.0 | 6.7 |
| 12 | 0.20 | 14 | Li | 7 | 0.96 | Ba | 0.4 | 6.1 |
| *13 | 0.21 | 14 | Li | 7 | 1.19 | Ba | 2.8 | 8.5 |
| *14 | 0.08 | — | — | — | 1.00 | Ba | 2.2 | poorly sintered |
| 15 | 0.08 | 3 | Li | 6 | 1.00 | Ba | 2.0 | 6.3 |
| 16 | 0.08 | 3 | Li | 6 | 1.00 | Ba | 2.0 | 6.3 |
| 17 | 0.08 | 7 | Li | 6 | 0.01 | Ba | 0.1 | 5.9 |
| 18 | 0.08 | 20 | Li | 6 | 4.00 | Ba | 5.0 | 9.1 |
| *19 | 0.08 | 22 | Li | 11 | 1.00 | Ba | 2.1 | 16.7 |
| 20 | 0.08 | 14 | Li | 10 | 5.00 | Ba | 2.0 | 9.1 |

Samples marked with * lie outside the scope of the invention.

It was confirmed by X-ray diffraction and X-ray microanalyzer that a crystal phase expressed by (Mg, Ti)$_2$(BO$_3$)O had been precipitated on the insulating layers of the circuit substrates other than the sample 11.

TABLE 2

| Sample No. | Conducting material | | | Surface roughness (μm) Ra | Interfacial electric conductivity σ × 10$^7$ Ω$^{-1}$·m$^{-1}$ 2 Ghz | Insertion loss dB |
|---|---|---|---|---|---|---|
| | Metal powder | Additive kind | pts. by wt. | | | |
| *1 | Ag | glass + V$_2$O$_5$ | 5 | 1.5 | 1.74 | −0.72 |
| 2 | Ag | glass + V$_2$O$_5$ | 5 | 1.0 | 2.90 | −0.57 |
| 3 | Ag | glass + V$_2$O$_5$ | 5 | 0.7 | 4.06 | −0.49 |
| 4 | Ag | glass + V$_2$O$_5$ | 5 | 0.5 | 5.22 | −0.44 |
| 5 | Ag | glass + V$_2$O$_5$ | 1 | 0.8 | 3.55 | −0.53 |
| 6 | Ag | glass + V$_2$O$_5$ | 10 | 0.4 | 5.20 | −0.43 |
| *7 | Ag | glass + V$_2$O$_5$ | 18 | 1.8 | 1.45 | −0.79 |
| 8 | Ag | glass + V$_2$O$_5$ | 3 | 0.4 | 5.31 | −0.43 |
| 9 | Ag | glass + V$_2$O$_5$ | 5 | 0.8 | 3.48 | −0.52 |
| *10 | Ag | glass + V$_2$O$_5$ | 5 | 1.2 | 2.32 | −0.64 |
| 11 | Ag | glass + V$_2$O$_5$ | 5 | 0.6 | 4.63 | −0.46 |
| 12 | Ag | glass + V$_2$O$_5$ | 5 | 0.3 | 5.48 | −0.43 |
| *13 | Ag | glass + V$_2$O$_5$ | 5 | 1.5 | 1.74 | −0.72 |
| *14 | Ag | glass + V$_2$O$_5$ | 5 | 2.0 | 1.18 | −0.82 |
| 15 | Ag | glass + V$_2$O$_5$ | 5 | 0.3 | 5.46 | −0.42 |
| 16 | Cu | glass + alumina | 3 | 0.4 | 5.27 | −0.43 |
| 17 | Ag | glass + V$_2$O$_5$ | 3 | 0.6 | 4.70 | −0.45 |
| 18 | Ag | glass + V$_2$O$_5$ | 5 | 0.7 | 4.07 | −0.48 |
| *19 | Ag | glass + V$_2$O$_5$ | 5 | 1.2 | 2.29 | −0.64 |
| 20 | Ag | glass + V$_2$O$_5$ | 5 | 0.8 | 3.48 | −0.53 |

Samples marked with * lie outside the scope of the invention.

As shown in Table 2, insertion losses of not smaller than 0.64 dB were exhibited by the samples having a coarseness Ra of smaller than 1 μm on the surfaces of the conductors on the side of the insulating layers and by the samples having interfacial electric conductivties σ at 2 GHz of not larger than 2.90×10$^7$ Ω$^{-1}$·m$^{-1}$. When the interfacial electric conductivties σ were controlled to be not smaller than 2.90×10$^7$ Ω$^{-1}$·m$^{-1}$ at 2 GHz in accordance with the present invention, the insertion losses were suppressed to be not larger than 0.57 dB. In the samples having a coarseness Ra of not larger than 0.5 μm on the surfaces of the conductors on the side of the insulating layers, in particular, it was learned that the insertion losses were not larger than 0.44 dB.

Experiment 2

A B$_2$O$_3$ powder, an Li$_2$CO$_3$ powder, an SiO$_3$ powder, and a powder of alkaline earth metal oxides (MgO, CaO, SrO, BaO) were added at compositions as shown in Table 3 to prepare glass frits. The thus prepared glass frits and a Mg$_2$SiO$_4$ powder and a MgTiO$_3$ powder having purities of not lower than 99% as starting materials were weighed at ratios as shown in Table 3, and were wet-mixed for 20 hours by a ball mill using ZrO$_2$ balls using pure water as a medium.

Next, the mixture was dried (dehydrated) and was calcined at 800° C. for one hour. The calcined product was pulverized such that the pulverized particles possessed diameters of not larger than 1.4 μm. By using this powder, a sample for evaluating dielectric properties was molded, i.e., a pole having a diameter of 0.01 m and a height of 0.008 m was press-molded under a pressure of 10,000 tons/m$^2$ and was fired at 900° C. for 2 hours to obtain a pole-like sample having a diameter of 0.008 m and a height of 0.006 m.

Through the X-ray diffraction measurement and X-ray microanalizer (EPMA), it was confirmed that the main crystal particles were the forsterite crystal particles in the samples of the invention, crystal particles represented by $(Mg, Ti)_2(BO_3)O$ existed depending upon the cases, and B, Li and alkaline earth metals existed as elements on the grain boundaries.

The dielectric characteristics of the samples were evaluated by measuring the dielectric constant capacitances and Q-values at a frequency of 10 GHz by the dielectric pole resonator method.

start temperature becomes as high as 870° C. as exhibited by the sample No. 11.

Furthermore, when the interfacial electric conductivities (at 2 Ghz) of the conductor portions of the above samples were measured in same manner as Experiment 1, those were not smaller than $2.90 \times 10^7 \ \Omega^{-1} \cdot m^{-1}$.

Experiment 3

A circuit substrate was prepared in quite the same manner as the sample No. 1 of Experiment 1 with the exception of forming the uppermost insulating layer by using the forster-

TABLE 3

| Sample No. | Main Component y | Parts by weight | | | | | Firing temperature (° C.) | Contraction start temp. (° C.) | 10 Ghz | |
|---|---|---|---|---|---|---|---|---|---|---|
| | | $B_2O_3$ | $Li_2CO_3$ | $SiO_2$ | Alkaline earth metal | Amount of oxide | $MnO_2$ | | | ∈r | σ-value |
| 1 | 0.3 | 14 | 7 | 1 | Ba, Ca | 2 | 1.5 | 900 | 850 | 7.0 | 1200 |
| 2 | 0.3 | 3 | 7 | 1 | Ba, Ca | 2 | 1.5 | 920 | 860 | 8.0 | 1500 |
| 3 | 0.3 | 5 | 9 | 1 | Ba | 2 | 1.5 | 900 | 850 | 7.5 | 1100 |
| 4 | 0.3 | 15 | 8 | 1 | Ba | 1 | 2.0 | 900 | 830 | 7.2 | 1200 |
| 5 | — | 20 | 10 | 1 | Sr | 1 | 3.0 | 870 | 760 | 6.0 | 1000 |
| 6 | 0.3 | 21 | 11 | 1 | Ba | 2 | 2.0 | 870 | 750 | 7.0 | 800 |
| 7 | 0.3 | 2 | — | 1 | Ba | 2 | — | 1150 | 1050 | 8.5 | 2000 |
| 8 | 0.5 | 14 | 7 | 1 | Ba, Ca | 2 | 1.5 | 900 | 850 | 8.8 | 1100 |
| 9 | 0.8 | 14 | 7 | — | Ba, Ca | 2 | 1.5 | 900 | 860 | 12.0 | 2000 |
| 10 | 0.9 | 14 | 7 | — | Ba | 2 | 1.5 | 900 | 850 | 14.0 | 2500 |
| 11 | 0.3 | 14 | 7 | — | — | — | 1.5 | 950 | 870 | 7.2 | 1700 |
| 12 | 0.3 | 14 | 7 | 1 | Ba, Ca | 5 | 1.5 | 890 | 800 | 8.5 | 1000 |
| 13 | 0.3 | 14 | 7 | 1 | Ba, Ca | 6 | 1.5 | 890 | 810 | 8.5 | 700 |
| 14 | 0.3 | 12 | 6 | 5 | Ba, Ca | 2 | 1.5 | 900 | 850 | 6.8 | 1100 |
| 15 | 0.3 | 15 | 4 | 10 | Ba, Ca | 2 | 1.5 | 900 | 850 | 6.7 | 1200 |
| 16 | 0.3 | 20 | 7 | 20 | Ca | 2 | 1.5 | 900 | 850 | 6.5 | 1100 |
| 17 | 0.3 | 20 | 7 | 30 | Mg | 2 | 1.5 | 900 | 850 | 6.1 | 1000 |
| 18 | 0.3 | 14 | 7 | 31 | Mg | 2 | 3.5 | 900 | 850 | 6.2 | 500 |
| 19 | 0.3 | 14 | 1 | 1 | Ba, Ca | 2 | 1.5 | 910 | 860 | 9.1 | 1000 |
| 20 | 0.3 | 14 | 7 | 1 | Ba, Ca | 1.5 | 1.5 | 900 | 850 | 6.8 | 1100 |
| 21 | 0.3 | 14 | 7 | 1 | Ba, Ca | 3.5 | 1.5 | 900 | 850 | 7.5 | 1000 |

From Table 3 above, the forsterite ceramics having a predetermined composition exhibits dielectric characteristics of a dielectric constant capacitance of from 6 to 14 and Q-values of not smaller than 500 at a measuring frequency of 10 GHz, and can be fired at a temperature of not higher than 920° C. Further, the contraction-start temperature by firing can be set to be not higher than 860° C.

In particular, when y in the composition formula $(1-y) Mg_2SiO_4 \cdot yMgTiO_3$ satisfies a molar ratio $0 \leq y \leq 0.8$, and when B is contained in an amount of from 3 to 20 parts by weight reckoned as $B_2O_3$, Li is contained in an amount of from 1 to 10 parts by weight reckoned as $Li_2CO_3$, Si is contained in an amount of from 0 to 30 parts by weight reckoned as $SiO_2$, and an alkaline earth metal is contained in an amount of from 1 to 5 parts by weight reckoned as an oxide, the ceramics exhibits the dielectric constant capacitance of from 6 to 12, Q-values of not smaller than 1000 at a measuring frequency of 10 GHz, and a firing temperature of from 870 to 920° C. and a contraction-start temperature of from 760 to 860° C. Thus, even when the substrate and the electronic part are cofired with the conductor composed chiefly of Ag or Cu, the occurrence of warping and distortion can be suppressed.

When Li is not contained, on the other hand, the firing temperature becomes as high as 1150° C. and the contraction-start temperature becomes as high as 1050° C. as exhibited by the sample No. 7, which, therefore, cannot be cofired with the conductor consisting chiefly of Ag or Cu.

When no alkaline earth metal is contained, the firing temperature becomes as high as 950° C. and the contractionite ceramics of sample No. 1 of Experiment 2. None of warping, crack or delamination occurred in this circuit substrate.

What is claimed is:

1. A circuit substrate equipped with an insulating board formed by laminating plural insulating layers and having a functional device with a conductor portion formed on a surface of one of the insulating layers in said insulating board, wherein the interfacial electric conductivity σ of said conductor portion at 2 GHz is not smaller than $2.9 \times 10^7 \ \Omega^{-1} \cdot m^{-1}$.

2. A circuit substrate according to claim 1, wherein a surface of said conductor portion contacting to said insulating layers has a roughness Ra which is not larger than 1 μm.

3. A circuit substrate according to claim 1, wherein said functional device is a resonator, a capacitor or a conductor.

4. A circuit substrate according to claim 1, wherein said conductor portion is formed chiefly of Ag or Cu.

5. A circuit substrate according to claim 1, wherein at least one layer of the plural insulating layers is formed of dielectric ceramics containing a composite oxide of Mg and Ti.

6. A circuit substrate according to claim 5, wherein said composite oxide is $MgTiO_3$ or $MgTiO_3$—$CaTiO_3$.

7. A circuit substrate according to claim 6, wherein said dielectric ceramics contains boron (B), an alkali metal, silicon (Si) and an alkaline earth metal.

8. A circuit substrate according to claim 7, wherein said dielectric ceramics contains a Mg—Ti composite oxide component represented by the following formula, MgTiO$_3$ and a Ca—Ti composite oxide component represented by the following formula, CaTiO$_3$ at a ratio that satisfies the molar composition represented by the following formula (I), (1−x)MgTiO$_3$·xCaTiO$_3$     (I)

wherein x is a number satisfying 0≦x≦0.2, and further contains B in an amount of from 3 to 20 parts by weight calculated as B$_2$O$_3$, an alkali metal in an amount of from 1 to 10 parts by weight calculated as a carbonate, Si in an amount of from 0.01 to 5 parts by weight calculated as SiO$_2$, and an alkaline earth metal in an amount of from 0.1 to 5 parts by weight calculated as an oxide per a total amount of 100 parts by weight of the Mg—Ti composite oxide component and the Ca—Ti composite oxide component.

9. A circuit substrate according to claim 5, wherein said dielectric ceramics contains crystal particles of said composite oxide and crystal particles of forsterite, as well as boron (B), lithium (Li) and alkaline earth metals which are existing on the grain boundaries.

10. A circuit substrate according to claim 9, wherein said dielectric ceramics contains the forsterite component represented by the following formula, Mg$_2$SiO$_4$ and the Mg—Ti composite oxide component represented by the following formula, MgTiO$_3$ at a ratio that satisfies a molar composition represented by the following formula (II), (1−y)Mg$_2$SiO$_4$·yMgTiO$_3$     (II)

wherein y is a number satisfying 0<y≦0.8, and further contains B in an amount of from 3 to 20 parts by weight calculated as B$_2$O$_3$, Li in an amount of from 1 to 10 parts by weight calculated as a carbonate, alkaline earth metals in an amount of from 1 to 5 parts by weight calculated as an oxide.

11. A circuit substrate according to claim 5, wherein said plural insulating layers include a first insulating layer and a second insulating layer that are formed of dielectric ceramics of different compositions and that are neighboring each other, and a common crystal phase represented by the following formula, (Mg, Ti)$_2$(BO$_3$)O is existing in the dielectric ceramics constituting the first insulating layer and in the dielectric ceramics constituting the second insulating layer.

12. A circuit substrate according to claim 1, wherein, among said plural insulating layers, the insulating layers in which the functional device generating capacity is formed are formed of dielectric ceramics which contains a Mg—Ti composite oxide component represented by the following formula, MgTiO$_3$ and Ca—Ti composite oxide component represented by the following formula, CaTiO$_3$ at a ratio that satisfies the molar composition represented by the following formula (I), (1−x)MgTiO$_3$·xCaTiO$_3$     (I)

wherein x is a number satisfying 0≦x≦0.2, and further contains B in an amount of from 3 to 20 parts by weight calculated as B$_2$O$_3$, an alkali metal in an amount of from 1 to 10 parts by weight calculated as a carbonate, Si in an amount of from 0.01 to 5 parts by weight calculated as SiO$_2$, and alkaline earth metals in an amount of from 0.1 to 5 parts by weight calculated as an oxide per a total amount of 100 parts by weight of the Mg—Ti composite oxide component and the Ca—Ti composite oxide component, and, among said plural insulating layers, the insulating layers in which the functional device generating capacity is not formed are formed of dielectric ceramics which contains the forsterite component represented by the following formula, Mg$_2$SiO$_4$ and the Mg—Ti composite oxide component represented by the following formula, MgTiO$_3$ at a ratio that satisfies a molar composition represented by the following formula (II), (1−y)Mg$_2$SiO$_4$·yMgTiO$_3$     (II)

wherein y is a number satisfying 0<y≦0.8, and further contains B in an amount of from 3 to 20 parts by weight calculated as B$_2$O$_3$, Li in an amount of from 1 to 10 parts by weight calculated as a carbonate, and alkaline earth metals in an amount of from 1 to 5 parts by weight calculated as an oxide.

* * * * *